United States Patent
Ura et al.

[11] Patent Number: 6,054,392
[45] Date of Patent: Apr. 25, 2000

[54] ACTIVE MATRIX SUBSTRATE AND METHOD OF FORMING A CONTACT HOLE IN THE SAME

[75] Inventors: Masashi Ura; Shoichi Takanabe, both of Tokyo; Nobuhiro Nakamura, Kumamoto; Yukio Endoh, Kumamoto; Osamu Itoh, Kumamoto, all of Japan

[73] Assignees: Mitsubishi Denki Kabushiki Kaisha, Tokyo; Advanced Display, Inc., Kikuchi-gun, both of Japan

[21] Appl. No.: 08/984,064

[22] Filed: Dec. 3, 1997

[30] Foreign Application Priority Data

May 27, 1997 [JP] Japan ................... 10-137255

[51] Int. Cl.⁷ .............................. H01L 21/302
[52] U.S. Cl. ............ 438/723; 438/30; 438/608; 438/724; 438/743; 438/744; 216/23
[58] Field of Search ............... 216/23; 438/30, 438/608, 694, 723, 724, 743, 744

[56] References Cited

U.S. PATENT DOCUMENTS

| | | | |
|---|---|---|---|
| 5,336,905 | 8/1994 | Bosman et al. | 257/54 |
| 5,431,773 | 7/1995 | Ikeda et al. | 216/23 |
| 5,703,436 | 12/1997 | Forrest et al. | 313/506 |

FOREIGN PATENT DOCUMENTS

| | | |
|---|---|---|
| 58-139123 | 8/1983 | Japan . |
| 63-284523 | 11/1988 | Japan . |
| 63-284524 | 11/1988 | Japan . |
| 1-098227 | 4/1989 | Japan . |
| 1-98227 | 4/1989 | Japan . |
| 4-261017 | 9/1992 | Japan . |

*Primary Examiner*—Robert Kunemund
*Assistant Examiner*—George Goudreau
*Attorney, Agent, or Firm*—Oblon, Spivak, McClelland, Maier & Neustadt, P.C.

[57] ABSTRACT

A method for forming a contact hole in an active matrix substrate, the method comprising steps of: (a) depositing an insulating film covering a first electrode provided on a substrate and the substrate; (b) forming a contact hole by patterning said insulating film by means of dry etching; and (c) forming a second electrode, and contacting the second electrode with the first electrode; wherein in the step (b) after forming a contact hole by dry etching, a surface treatment by plasma etching or reactive ion etching with oxygen gas under a condition in which a pressure P is in a range of 100 Pa to 400 Pa is performed.

14 Claims, 4 Drawing Sheets

ACTIVE MATRIX SUBSTRATE AND METHOD OF FORMING A CONTACT HOLE IN THE SAME

BACKGROUND OF THE INVENTION

The present invention relates to a method of forming a contact hole in an insulating film or a semiconductor film formed on an insulating substrate. More particularly, the present invention relates to the dry etching method for forming a hole for electrical contact (hereinafter referred to as contact hole) between an electrode of chrome or chrome compound formed on the insulating substrate as an active matrix substrate for a liquid crystal display apparatus and an upper electrode, and relates to the processing method after the dry etching operation.

A matrix type liquid crystal display apparatus is formed to interpose liquid crystal material between a substrate on which TFTs (thin film transistors) made of semiconductor thin films are provided and an opposite substrate, and to apply electrical voltage to the display material selectively for each pixel. Opposite electrodes, color filters, black matrices are on the opposite substrate. The liquid crystal display for which such TFT array substrate is employed is hereinafter referred to as TFT-LCD.

To the TFT array substarate, at least TFTs and pixel electrodes are provided for each pixel in a matrix manner on an insulating substrate made of glass and so on, and further alignment films and storage capacitances if necessary are provided and still further signal lines such as gate lines and source lines are provided.

So as to produce the TFT-LCD, TFTs, gate lines, source lines and other common lines are produced in an array manner to form a display area and input terminals, auxiliary lines and drive circuits are provided on the periphery of the display area. At the same time, so as to obtain their function, conductive films and insulating films are provided if necessary. Further, opposite electrodes, color filters, black matrices are provided on the opposite substrate.

After producing the TFT array substrate and the opposite substrate, keeping a desired gap between two substrates, the two substrates are adhered on the periphery. Thereafter, a liquid crystal material is introduced into the gap and a liquid crystal display is produced.

Various semiconductor devices and solid state devices are provided on the TFT array substrate and on the opposite substrate for a liquid crystal display device, using thin film technology. In such semiconductor devices and solid state devices, semiconductor films, insulating films or conductive films are used.

In a liquid crystal display device, contact holes are provided on necessary portions through interlayer insulating films so as to obtain a contact between a pixel and a gate line; a contact between a pixel and a source line and further between a pixel and a drain line; and a contact between one line and another line. A dry etching method is adopted for forming a contact hole penetrating an interlayer. $SF_6$ gas, $CF_4$ gas or mixed gases comprising at least one of $SF_6$ gas and $CF_4$ gas, and $O_2$ gas or inert gases are usually employed for dry etching. Above all, a combination of $SF_6$ gas and $O_2$ gas as the most popular gas for the etching rate and selectivity to an underlayer film.

When forming a contact hole, normally the taper shape of the contact hole is controlled by the ratio of photoresist to that of object layer.

In this case, a gas in which fluorine gas and $O_2$ gas are mixed is employed. If flow rate of $O_2$ gas is increased, a photoresist is fastly etched and the size of the contact hole becomes large or the photoresist is lost. So, the flow rate of $O_2$ gas is suppressed lower than that of other mixed gas. And, it is popular that oxygen plasma treatment is conducted after etching operation to remove the plasma damage layer of the photoresist.

Under the etching condition for an insulating film (SiN), a chrome film (hereinafter referred to as a chrome film) can hardly be etched. Some gases are adsorbed on the surface of the chrome film.

Further, etching reaction products adhere to the surface of the chrome film. Therefore, when depositing an ITO film on the contact hole, a preferable electric contact cannot be obtained.

In most cases, an electric resistance value of a contact hole intervening the two films made of the same material, as for example on a chrome film another chrome film is deposited, is low. Further, there are some cases in which resistance value of several kilo-ohms can be applicable for some devices. Thus, these contact holes did not raise a specific problem. However, when we use chrome film line and deposit ITO film on the line and contact through the contact hole, the conventional etching conditions cause extremely high contact resistance not to be used of several megohms. There arises such a neccesity of reducing resistance below several hundred ohms to improve display property.

As a result of researching, it was found that the contact resistance could be particularly high in the case where material of upper layer is different from that of a lower layer, for instance the lower layer is made of a material such as chrome not to be almost etched in the condition of etching on an insulating film, and the upper layer is made of a material such as ITO, aluminum.

SUMMARY OF THE INVENTION

The object of the present invention is to solve the problem mentioned above in the prior art, and to provide an active matrix substrate and a method for forming a contact hole in the substrate, further to provide a liquid crystal display apparatus using the substrate.

As a result of considering the method for lowering the contact resistance between a chrome film and an ITO film, it was found that the contact resistance could be remarkably decreased by the etching condition and the secondary treatment condition after etching operation.

It was found that a plasma treatment by oxygen after etching operation was effective as one of the secondary treatment condition. An effect due to the plasma treatment has such a characteristic to strongly depending upon a pressure for the treatment. In the conventional condition for photoresist ashing, only removing of the damaged photoresist surface layer is considered, and as is often the case, the resistance is increased. Therefore, it is necessary to reconsider the condition for photoresist ashing. Particularly, once the contact resistance is increased by subjecting to an oxygen plasma treatment, it is difficult to lower the contact resistance by only the dry etching apparatus.

As a means for not controlling the contact resistance by dry etching, there is such a case where wet treatment is effective (for instance in the case where the contact resistance has been increased). However, it was found that even in the case where wet treatment is merely performed, desirable result cannot be contained by etchant by which chrome is etched, and such an etchant containing oxidizing agent should be used.

Further, if there arises such a problem that the means mentioned above cannot be performed due to the restriction of number of subjecting treatment in the mass production steps, this problem can be solved by increasing a flow rate of oxygen in the dry etching condition. But, there are some cases that additional oxygen plasma treatment is better due to the restriction such as hole size, taper angle.

By virtue of subjecting to a plasma treatment, gas and something adhered to the surface of chrome electrode is reduced or removed, so that the chrome film can be desirably contacted with ITO film or other conductive substances located on upper layer.

On the basis of results from researching so as to obtain a low resistance contact hole, claim 1 of the present invention is directed to a method for forming a contact hole in an active matrix substrate, the method comprising steps of:

(a) depositing an insulating film covering a first electrode provided on a substrate and the substrate;

(b) forming a contact hole by patterning the insulating film by means of dry etching; and (c) forming a second electrode, and contacting the second electrode with the first electrode;

wherein in the step (b) first etching gas is a mixture of $CF_4$ and oxygen gas; and wherein the insulating film is patterned under etching condition where a flow rate of oxygen gas is larger than a flow rate of $CF_4$ gas.

In accordance with the method for forming a contact hole of claim 2, the first electrode is composed of chrome, and the second electrode can be composed of any one of chrome, aluminum, and indium tin oxide.

In accordance with the method for forming a contact hole of claim 3, in practical use the flow rate of oxygen gas is preferably in the range of 50% to 95% of total flow.

In accordance with the method for forming a contact hole of claim 4, inert gas can be further mixed with the first dry etching gas, so that uniformity of etching rate in the substrate can be good.

In accordance with the method for forming a contact hole of claim 5, as the above-mentioned inert gas, any one of argon and helium can be used.

In accordance with the method for forming a contact hole of claim 6, in the step (b) using second dry etching gas composed of any one of fluorine gas or a mixture of fluorine gas and oxygen gas, the insulating film is etched until 50% to 100% of total etching amount, thereafter the insulating film is etched using the first dry etching gas under the predetermined etching condition until desired etching amount, so that etching operation can be preferably performed without losing resist pattern even in the case where insulating film is thick.

In accordance with the method for forming a contact hole of claim 7, in the step (b) even in the case where inert gas is mixed with the dry etching gas, and etching is performed in two steps, the etching uniformity is preferably small. In this case, argon and helium are generally used.

The invention of claim 8 is directed to a method for forming a contact hole, the method comprising steps of:

(a) depositing an insulating film covering a first electrode provided on a substrate and the substrate;

(b) forming a contact hole by patterning the insulating film using dry etching; and (c) forming a second electrode and contacting the second electrode with the first electrode;

wherein in the step (b) after forming the contact hole, the gas or reaction product adhered to the surface of the first chrome electrode can be removed by plasma etching using oxygen gas, so desirable contact can be attained.

In accordance with the method for forming a contact hole of claim 9, pressure P for plasma etching using oxygen gas is in the range of 50 Pa to 400 Pa. In the case where the pressure is less than 50 Pa the effect of surface treatment is low, and in the case where the pressure is more than 400 Pa the practical level capable of obtaining oxygen plasma in this apparatus. Therefore, it is preferable that the pressure P is in the range of 50 Pa to 400 Pa.

In accordance with the method for forming a contact hole of claim 10, an effect of a surface treatment is obtainable in a practical use when a pressure P for the surface treatment is in the range of 150 Pa to 250 Pa.

In accordance with the method for forming a contact hole of claim 11, the plasma etching with oxygen can be performed in the same process chamber in which the step (b) is performed.

In accordance with the method for forming a contact hole of claim 12, the plasma etching with oxygen can be performed in other process chamber or other apparatus.

The invention of claim 13 is directed to a method for forming a contact hole, the method comprising steps of:

(a) depositing an insulating film covering a first electrode provided on a substrate and the substrate;

(b) forming a contact hole by patterning the insulating film using dry etching; and (c) forming a second electrode and contacting the second electrode with the first electrode; wherein in the step (b) after forming a contact hole a surface treatment is performed for the contact hole by reactive ion etching (RIE) mode under a condition in which a pressure P for the surface treatment is in a range of 100 Pa to 400 Pa, so low contact resistance can be attained.

In accordance with the method for forming a contact hole of claim 14, the pressure P for surface treatment is in a range of 150 Pa to 250 Pa, so that a remarkable effect can be attained.

In accordance with the method for forming a contact hole of claim 13, the surface treatment can be performed in the same process chamber in which the step (b) is performed.

In accordance with the method for forming a contact hole of claim 14, the surface treatment can be performed in other process chamber of a process apparatus in which the step (b) is performed or an other process apparatus.

DETAILED DESCRIPTION

Hereinafter, embodiments of the present invention are explained in detail referring to drawings.

EMBODIMENT 1

Figure 1:
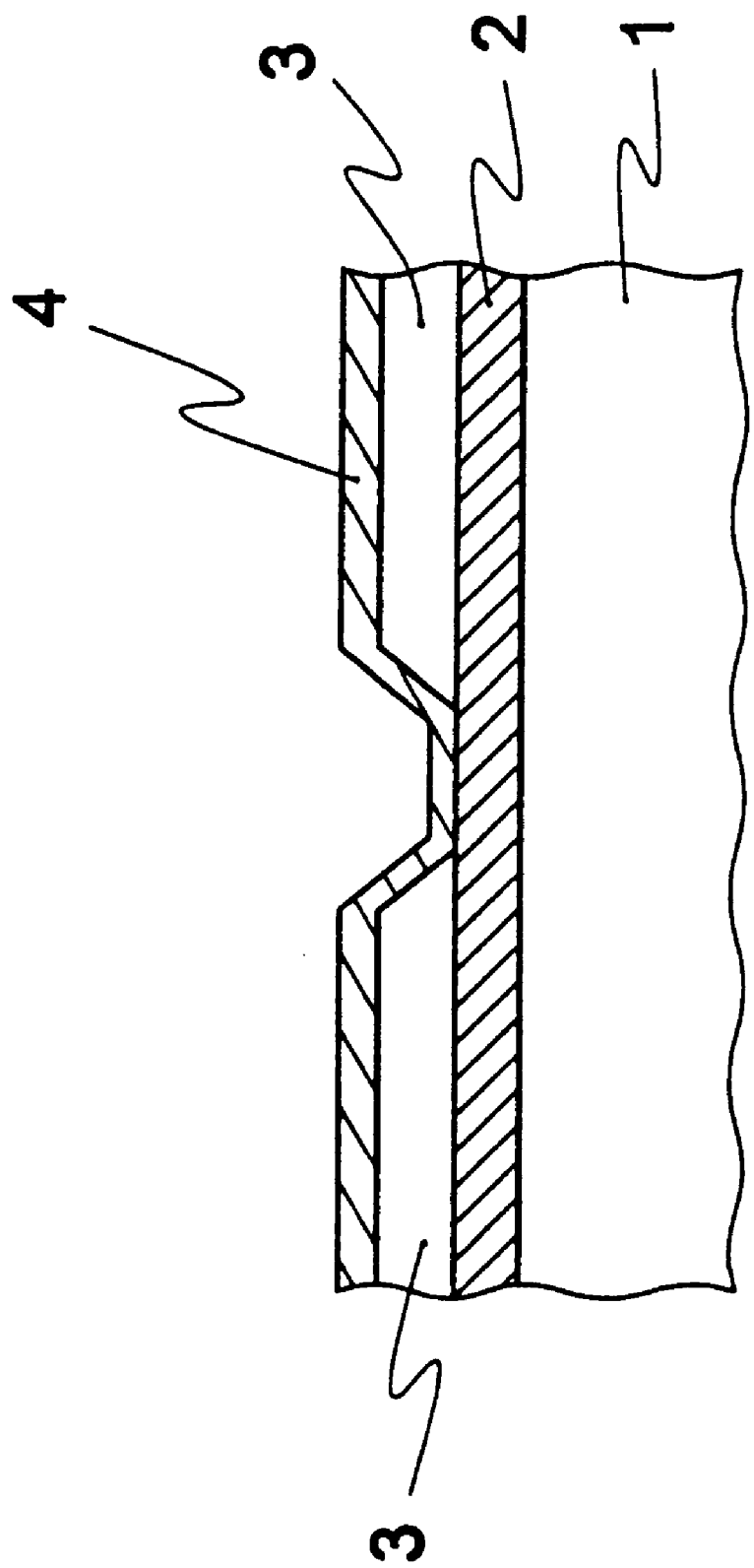
FIG. 1 is a sectional view of the contact portion in the active matrix substrate according to the present invention.

An active matrix substrate according to one embodiment of this invention and a method of forming a contact hole of an active matrix substrate will be described. FIG. 1 is a sectional view showing construction of a contact hole in an active matrix substrate. Referring to the drawing, reference numeral 1 denotes an insulating substrate, reference numeral 2 denotes a gate electrode made of a chrome film which is a first electrode, reference numeral 3 denotes an insulating film provided as a gate insulating film, reference numeral 4 denotes a transparent conductive film, which is patterned to form a pixel electrode which is a second electrode. In this embodiment, a configuration where a semiconductor film is not provided on an insulating film is described. A semiconductor film can be often provided, depending upon the design of a TFT array substrate. In this case, a contact hole can penetrate through the semiconductor film. A method of forming a contact hole described below can be applicable even to penetration through the semiconductor film.

A method of forming a contact hole shown in a contact portion will now be described in accordance with a manufacturing step of a contact portion.

In the first step a gate insulating film is deposited on a gate electrode 2 on an insulating substrate 1. The insulating substrate 1, such as a glass plate, of approximately 370 mm×470 mm in size, and approximately 0.7 mm in thickness is used. A gate electrode 2, for example, made of chrome or chrome compound, is provided for inputting a scanning signal to a pixel and is formed to approximately 400 nm in thickness in a predetermined position by a sputtering method. A gate insulating film 3 made of, for example, silicon nitride, is formed to approximately 400 nm in thickness and covers the gate electrode and the entire portion of an insulating substrate 1. As a material of the gate insulating film, silicon oxide or the like in place of silicon nitride can be similarly used.

As the second step, the contact hole is formed by photolithography. Namely, the contact hole is formed by a dry etching operation with a photoresist pattern being applied on a predetermined position on a gate insulating film 3. The photoresist is applied to approximately 1.6 μm thick in a predetermined position and is baked at 160° C. The dry etching operation is conducted by using mixed gas, for example, $SF_6$ gas and oxygen gas, under conditions of pressure of approximately 16 Pa, and power of approximately 2000 W. A hole for reaching a gate electrode is perforated in the gate insulating film.

In the third step, a conductive film 4 is deposited and patterned by photolithography, and the pixel electrode comes into contact between the gate electrode and the pixel electrode through the contact hole. A conductive film is, for example, ITO, and is formed to approximately 100 nm in thickness by a sputtering method. During the dry etching operation for forming the contact hole, the surface of the chrome film is normally exposed to plasma. If the chrome surface can be etched in some extent with etching gas, reaction gas can be removed immediately even on the surface of the chrome film. But chrome can hardly be etched under the normal dry etching conditions for silicon and silicon nitride. Gas adsorbed onto the surface of the chrome film and a reaction product (hereinafter referred to as adsorbed matter) by the dry etching operation are hard to be removed. These adsorbed matters let the contact with the ITO film inferior, thus increasing the contact resistance.

A method of reducing the adsorbed matter on the surface of the chrome film is classified roughly into two. One is that the adhering operation is avoided during the etching operation; the other is that adhered matters are removed later.

A method of preventing adhering during the etching operation comprises steps of increasing a rate of oxygen gas in etching gas, combining it with unnecessary gas, and exhausting it out of the chamber. This method is easy at first sight, because this method has only to increase a flow rate of oxygen gas originally to be included in the etching gas. But the flow rate of the oxygen gas is increased, the etching rate of the photoresist increases. Then, the pattern shift (size difference between photoresist pattern and etched pattern) becomes larger. In some case, the photoresist pattern itself may become to be lost during the etching operation. Thus, this method is possible to operate only when the insulating film is extremely thin, or the etching time is short. $CF_4$ gas, instead of $SF_6$ gas often used generally, is used as fluoride strain gas in a mixed gas. It is found out by inventors that the adsorbing amount on the surface of the chrome film is less, and the contact resistance is lower by factor of about 10 than hexafluoride sulphur gas used.

The etching conditions in a case where the insulating film is approximately 100 nm are as follows ("RIE" is an abbreviation for "reactive ion etching").

| | |
|---|---|
| Etching mode: | RIE |
| High frequency wave voltage power source: | 13.56 MHz, 300 W |
| Etching gas: | mixed gas of $CF_4$ gas/30 sccm and oxygen gas/80 sccm |
| Processing pressure of gas: | 5 Pa |
| Electrode plates distance: | 65 mm |
| Electrode plates temperature: | 25° C. |

In the embodiment 1, the mixed gas of $CF_4$ and $O_2$ is used, and oxygen gas is defined set to become more than the flow $CF_4$ gas. The flow amount of the oxygen gas is preferable to become 50% of the total flow amount to 95%. The reason why the flow is limited to 50% or more is because the rate of adsorption amount increases to this extent. A reason why it is limited to 95% or lower is because when a rate of the oxygen gas flow amount increases, the etching rate of the silicon nitride drops and the etching rate of the photoresist increases to become a limit capable of an etching operation. Further, it is preferable that an adsorbing operation is hard to occur to have the oxygen flow amount of 70% or more through 95% or lower.

When inert gas is further mixed with mixed gas to be used in the dry etching operation in a case of this embodiment, the variation of etching rate in the substrate can be made smaller to improve the uniformity of the etching operation. As inert gas, for example, argon (Ar) gas, helium (He) gas or both of them can be used. By using this gas the etching uniformity can be improved easily. The flow amount rate of the oxygen gas in the mixed gas is also 50% or more through 95% or lower when the inert gas is mixed.

In this embodiment, a case where the second electrode is a transparent conductive film composed of ITO is explained. Even when chrome or aluminum is used to the second electrode, lower contact resistance can be obtained.

EMBODIMENT 2

An embodiment 2 is applicable when the thickness of the insulating film composed of silicon nitride is approximately 100 through 400 nm.

| | |
|---|---|
| Etching mode: | RIE |
| High frequency voltage power source: | 13.56 MHz, 1000 W |
| Etching gas: | mixed gas of tetrafluoride carbon gas/50 sccm and oxygen gas/60 sccm |
| Pressure for etching: | 5 Pa |
| Electrode plates distance: | 65 mm |
| Electrode plates temperature: | 25° C. |

EMBODIMENT 3

In an embodiment 3, the majority, 50% to 100% of the total etching amount, of an etching operation on an insulating film composed of silicon nitride, is conducted in accordance with the conventional etching conditions where the selectivity rate to photoresist is large. The latter etching and over etching are conducted by increasing the flow amount of the oxygen gas. When the surface of the chrome film appears, we change the etching condition. The reason why the etching amount is limited to 50% or more is because photoresist is lost in a latter etching operation. Further, there is a very little possibility of appearing chrome surface up to 50%, judging from the uniformity of the etching. A reason why it is limited to 100% or lower is because the adsorbed matter on the chrome electrode keeps small. By the two stage etching operation, critical dimension control is easy and a problem of losing the pattern can be solved.

Conditions of etching gas or the like of two stage etching operation are as follows.

| | First | Second |
|---|---|---|
| Etching mode: | RIE | RIE |
| High frequency voltage power source: | 13.56 MHz, 800 W | 13.56 MHz, 300 W |
| Etching gas: | mixed gas of tetrafluoride carbon gas/250 sccm and oxygen gas/110 sccm | mixed gas of tetrafluoride carbon gas/30 sccm and oxygen gas/80 sccm |
| Pressure for etching: | 5 Pa | 5 Pa |
| Electrode plates distance: | 65 mm | 65 mm |
| Electrode plates temperature: | 25° C. | 25° C. |

The exchange point is decided by monitoring the luminescence intensity of nitrogen by an EPD (end point detector). Considering the etching rate, the second processing time is decided to become a desired amount or an over etching amount of, for example, approximately 20%.

Other manufacturing conditions except for etching conditions shown here, i.e., the types of the electrode materials, and so on to be used are the same as those of the embodiment 1, so as to obtain the same effect as that of the embodiment 1.

Although any gas can be used in the initial conditions, the quantity of adhered matter on the chrome surface depends on the first dry etching. For example, when the first dry etching gas is chiefly composed of $SF_6$ gas, it is difficult to obtain a sufficient contact without a post processing operation. When the second processing time is made longer excessively, photoresist may be lost or an amount of pattern shift becomes larger.

By using the two step dry etching operation, an effect can be obtained even in the case of the thick insulating film without losing the photoresist pattern.

Embodiment 4

Figure 2:
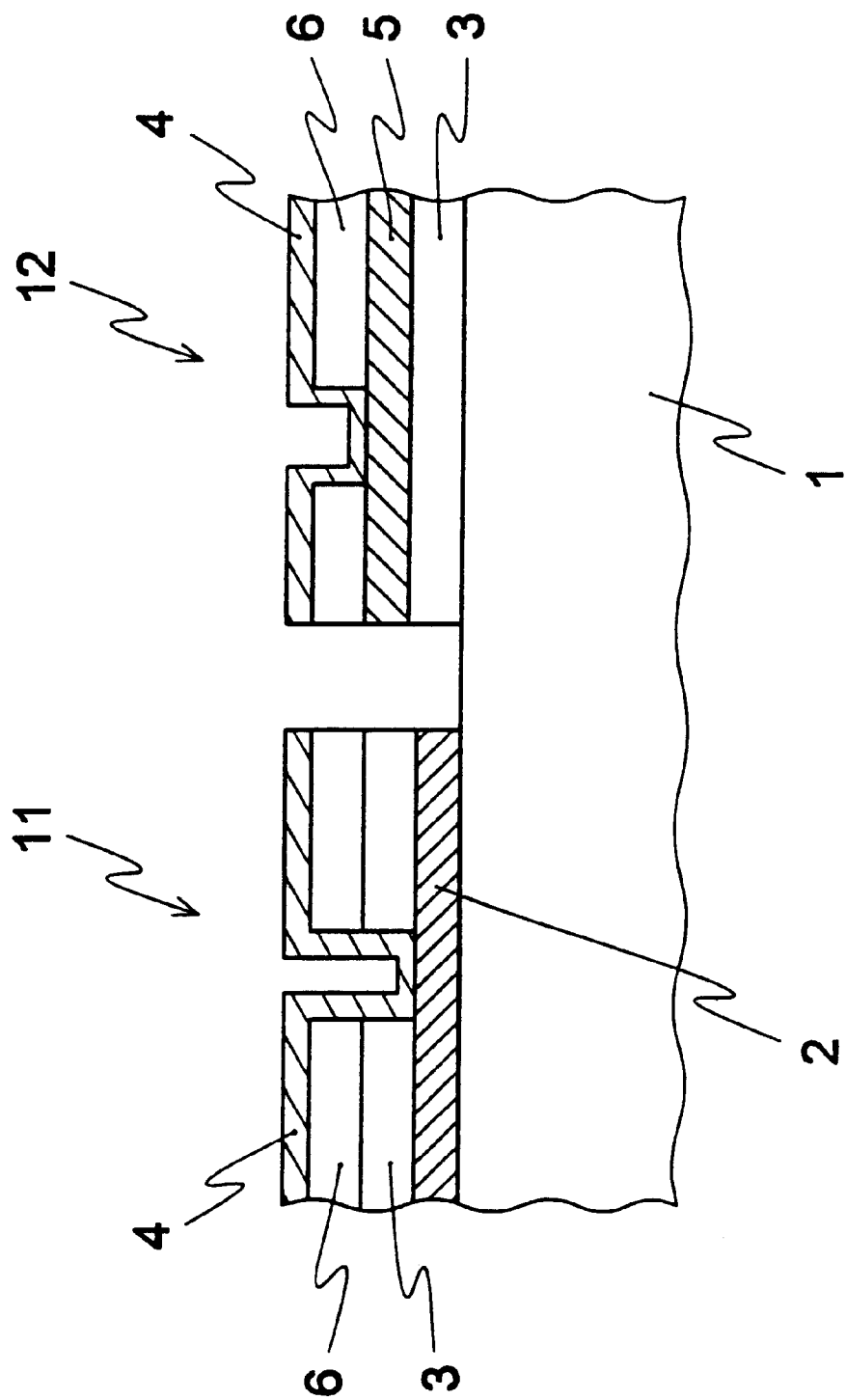
FIG. 2 is a schematic sectional view of the contact portion when etching both the gate insulating film and the insulating film on the source electrode at the same time.

As described above, in the embodiments 1 through 3 reaction products are not adsorbed into the chrome film during the etching operation. According to some working conditions, it is difficult not to make reaction products adsorb on the chrome film. For example, the gate insulating film and the insulating film on a source line have to be etched at one time. FIG. 2 is a schematic sectional explaining view showing the contact portion. Reference numerals 1 through 4 shown in FIG. 2 are the same as those of FIG. 1. Reference numeral 5 denotes a source electrode, reference numeral 6 denotes an insulating film, reference numeral 11 denotes a gate terminal portion, and reference numeral 12 denotes a source terminal portion. When the contact hole is formed simultaneously to the lowest layer of the gate electrode and to the electrode for an upper source line on the upper insulating film, a chrome film of the upper layer is exposed to the plasma of the etching gas simply by a time period (approximately twice as much) required to perforate a hole in the lowest layer of the chrome film after a hole in an electrode for the upper hole is formed. A post processing operation is required in this case.

A contact hole forming method described in the embodiments 4 and 5 is to conduct further an oxygen plasma treatment after the etching operation. The conditions of the plasma is as follows.

| | |
|---|---|
| Etching mode: | PE |
| High frequency voltage power source: | 13.56 MHz, 1500 W |
| Etching gas: | oxygen gas/500 sccm |
| Pressure for etching: | 200 Pa |
| Electrode plates distance: | 65 mm |
| Electrode plates temperature: | 25° C. |
| Processing time: | 30 sec. |

This oxygen plasma operation is different in an object and an effect from that of so-called light ashing conducted conventionally. An oxygen plasma processing operation conducted conventionally is conducted with an object of partially removing the damaged surface layer of the photoresist during the dry etching operation. In this case, the contact resistance is often increased, because conditions are decided simply by ashing amount of photoresist.

In this embodiment, a contact hole is formed by a dry etching operation, then an oxygen gas is introduced within the same apparatus or a different apparatus to generate oxygen plasma, and the surface treatment of the electrode of the contact hole is conducted by oxygen plasma. In addition to the oxygen plasma processing conditions explained in this embodiment, a dry etching operation in forming a contact hole can be conducted by any method and conditions. Other manufacturing conditions and kinds of an electrode material to be used are the same as those of the embodiment 1.

At this time, it is preferable that pressure P for processing in oxygen plasma is in a range of 50 Pa to 400 Pa. The reason why pressure is limited to lower than 400 Pa is because 400 Pa is a limit to which it can be realized easily by the apparatus. The reason why pressure is limited to higher than 50 Pa is because the contact resistance decreases. In this range, oxygen plasma can be obtained without conventional facilities being renovated, and the contact resistance can be lowered. Within above-mentioned pressure, in the range of 150 Pa to 250 Pa, contact resistance can be easily lowered.

This process can be conducted continuously after the dry etching in the same process chamber or in other process chamber.

Further, the same effect can be obtained if this oxygen plasma operation is conducted in a different apparatus.

EMBODIMENT 5

Although an oxygen plasma processing operation is conducted in plasma etching mode in the embodiment 4, a processing operation can be conducted in RIE (reactive ion etching) mode, instead of a plasma etching mode. The other conditions during the processing operation in a RIE mode is the same as those of the embodiment 4. One example of the conditions of the processing operation in the RIE mode is shown.

| | |
|---|---|
| Etching mode: | RIE |
| High frequency voltage power source: | 13.56 MHz, 1000 W |
| Etching gas: | oxygen gas/500 sccm |
| Pressure for etching: | 200 Pa |
| Electrode plates distance: | 135 mm |
| Electrode plates temperature: | 25° C. |
| Processing time: | 30 sec |

At this time, it is preferable that a processing pressure P in oxygen plasma is in a range of 100 Pa to 400 Pa. A processing pressure is decided as an optimum value in accordance with other parameters such as RF power, ashing rate of photoresist and so on. A reason why pressure is limited to lower than 400 Pa is because 400 Pa is a limit to which it can be realized easily by the apparatus. A reason why pressure is limited to higher than 100 Pa is because the contact resistance is low. It is preferable the processing pressure P of oxygen plasma is in the range of 150 Pa to 250 Pa for making the contact resistance lower. The surface treatment by oxygen plasma is performed on the electrode surface of the contact hole in this manner, so that absorbed matter on the surface can be removed, and low contact resistance can be obtained.

Figure 3:
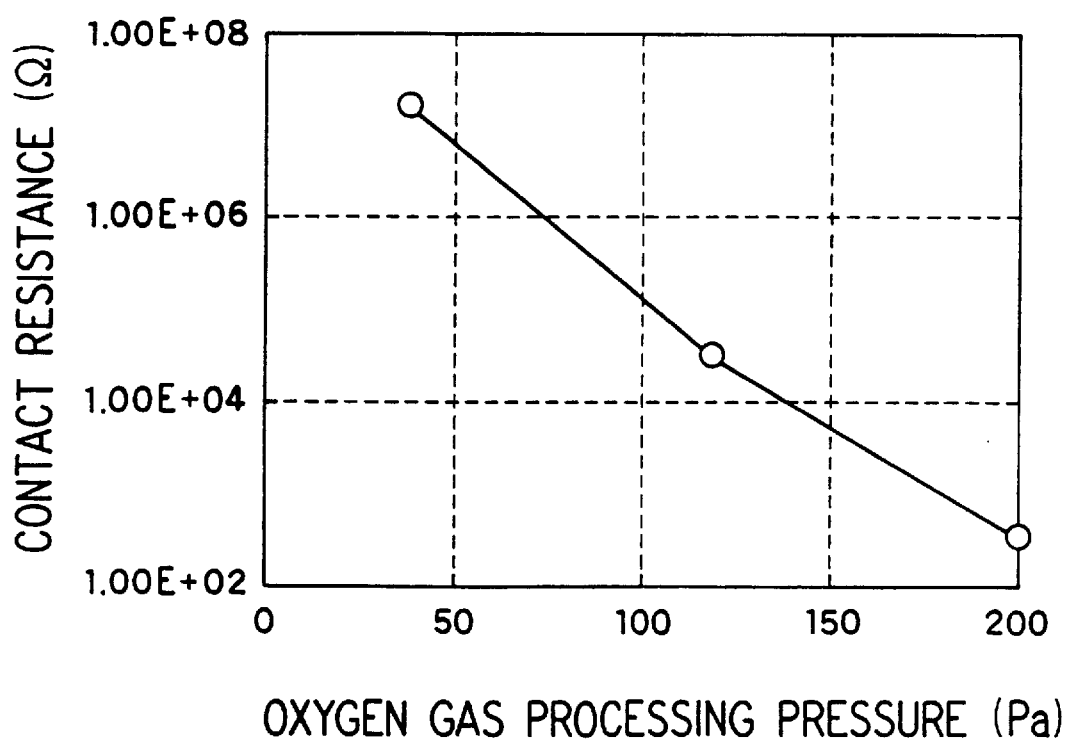
FIG. 3 is a diagram illustrating a relationship between oxygen plasma treatment pressure and contact resistance.
Figure 4:
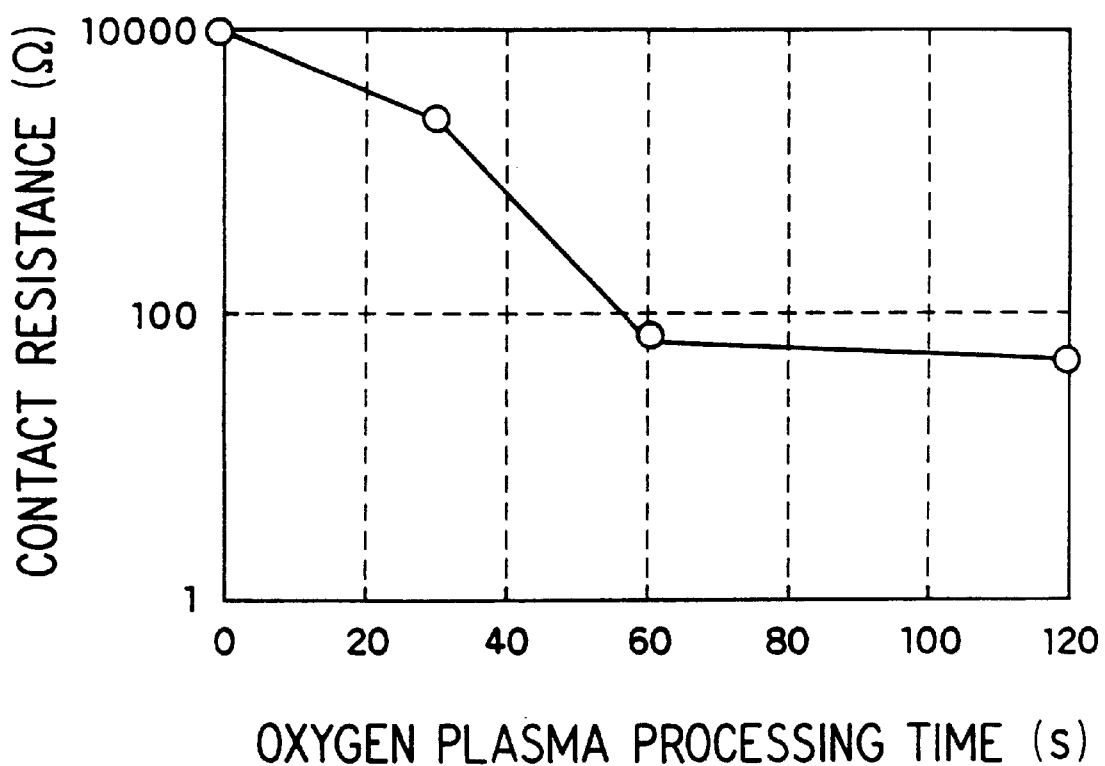
FIG. 4 is a diagram illustrating a relationship between oxygen plasma treatment time and contact resistance.

FIG. 3 indicates influences of $O_2$ gas processing pressure with respect to contact resistance, about contact resistance between chrome film and ITO film, of 35 $\mu$m square after the oxygen plasma processing operation in RIE mode. According to FIG. 3, contact resistance changes largely depending upon oxygen plasma conditions, and hence lower resistance is obtained in lower vacuum. FIG. 4 shows the relationship between oxygen plasma process time and contact resistance. Referring to FIG. 4, a sufficient effect cannot be obtained in short period of time. Approximately 30 seconds processing operation is found to be necessary. This necessary time changes due to etching conditions in the contact hole forming operation. The contact property also depends upon the RF power of the oxygen plasma. If the contact resistance increases by the oxygen plasma processing operation, the contact resistance cannot be improved sometimes in the plasma processing by additional plasma processing operation. Special attention is necessary to the conditions of the oxygen plasma processing operation in this case. The processing operation can be conducted continuously after the etching operation in the same process chamber or other process chamber.

In the embodiments 4 and 5, time for chrome film surface to be exposed to etching is long. Needless to say, it is effective when an insulating film is thin.

EMBODIMENT 6

When measures explained in the embodiments 1 through 5 cannot be taken due to conditions of dry etching or relationship of the number of the substrate processing, and adhesion product cannot be removed easily, there is a method of removing a surface layer by the wet etching operation. This embodiment is the same as the embodiment 4 in that the surface layer is removed by the wet etching, instead of the dry etching.

In a method of the embodiment 6, a substrate processed by dry etching is put in a mixed liquid of ammonium cerium nitrate and nitric acid after a general dry etching operation, so as to refresh chrome surface. In this case, it is generally conducted immediately after the dry etching operation, but it does not matter after photoresist is removed. When we use mixed liquid of ammonium cerium nitrate and perchloric acid to be generally used as etchant for chrome, it is impossible to decrease the high contact resistance. But, when the mixed liquid of ammonium cerium nitrate and nitric acid is used, it is possible to remove the adhesion product. Although detailed mechanism is not known, in some of etching liquid capable of etching for chrome film, adhesion product and surface layer can be removed, so as to retain better contact.

In this case, in some etching liquids, a control operation has to be conducted to remove only the surface layer so as not to remove the chrome film.

EMBODIMENT 7

An active matrix substrate manufactured in accordance with a method for forming a contact hole explained in embodiments 1 through 6, and a liquid crystal display apparatus in which the active matrix substrate is provided will be described.

An active matrix substrate, and a construction of a liquid crystal display apparatus using an active matrix substrate, and a method of manufacturing it, are similar to those of conventional art.

For example, a chrome film is deposited on the insulating substrate, and is conducted a patterning operation, so as to be a gate electrode. A silicon nitride film which is a gate insulating film and silicon film which is a semiconductor layer are deposited with a CVD method. The silicon film is patterned, so as to be located only in a TFT portion and in its vicinity. A chrome film which is a source drain electrode is deposited on it, and is conducted a patterning operation. An insulting film is formed on it.

A contact hole is formed by either method explained in the embodiments 1 through 6. An ITO film which is a pixel electrode is deposited and patterned, so as to complete an active matrix substrate. In order to form a contact hole using a method from the embodiments 1 to 6, the contact resistance becomes lower. It becomes possible to make a manufacturing process an active matrix substrate with a construction of directly contacting an ITO film or the like on a chrome film, with an effect that a low contact resistance can be realized. A liquid crystal displaying apparatus using an active matrix substrate according to this invention can obtain an effect of having superior quality free from inferior product according to contact resistance.

By the above-described explained method, silicon nitride which is an insulting film is deposited on a chrome film and a contact hole is formed through a dry etching operation, also we realize a better contact even in the depositing of an ITO film.

A method for forming a contact hole of an active matrix substrate according to claim 1 of this invention comprising a step (a) of depositing an insulating film by covering a first electrode provided on a substrate, and the substrate, a step (b) of conducting a patterning operation by a dry etching operation of the insulating film so as to form a contact hole, and a step (c) of forming a second electrode to come into contact between a second electrode and a first electrode, in the step of the (b), first dry etching gas is mixed with tetrafluoride carbon gas and oxygen gas, and under conditions where the flow of the oxygen gas is more than the flow of tetrafluoride carbon gas, the insulating film is processed by dry etching and is patterned so as to form a contact hole, and the after processing operation is not necessary, thus achieving an effect that the contact resistance is lower.

According to claim 2 of this invention, a first electrode is composed of chrome, and a second electrode is composed of either of chrome, aluminum and indium tin oxide, with an effect of achieving a contract which is of low resistance with various materials.

According to claim 3 of this invention, the flow of the oxygen gas is 50% or more through 95% or lower of the total flow, thus achieving an effect of achieving a contact which is low in resistance in a preferable range in practical use.

According to claim 4 of this invention, when the first dry etching gas is a mixed gas including further an inert gas, thus achieving an effect that variation of the etching rate within the substrate can be made smaller.

According to claim 5 of this invention, the inert gas is either of argon gas or helium gas, thus achieving an effect capable of dry etching operation by using popular gases.

According to claim 6 of this invention, an etching operation is conducted up to 50% or more through 100% or lower of the total etching amount of the insulating film with a second dry etching gas which is either of fluorine gas single or a mixed gas of fluorine gas and oxygen gas in the step (b). When an over etching operation is conducted up to a desired amount under the aforementioned etching conditions, a resist pattern is not lost even when the insulating film is thick, thus achieving an effect capable of conducting an etching operation.

According to claim 7 of this invention, when a first dry etching gas is a mixed gas including an inert gas in the (b) step, with an effect that the variation of the etching rate within the substrate face can be made smaller even when an etching operation is conducted by two stages.

According to claim 8 of this invention, a method of forming a contact hole according to this invention comprising a step (a) of forming an insulating film by covering a first electrode provided on a substrate, and the substrate, a step (b) of conducting a patterning operation by a dry etching operation of the insulating film so as to form a contact hole, and a step (c) of forming a second electrode to come into contact between the second electrode and the first electrode, in the step of (b), the contact hole is formed, then a plasma processing operation is conducted in a plasma etching mode under proper processing pressure in an oxygen gas. Adhesion product on the chrome electrode surface adhered by the dry etching in contact hole forming operation can be removed, thus achieving an effect that low sufficient contact can be provided.

According to claim 9 of this invention, the processing pressure P with the oxygen gas is in a range of 50 Pa to 400 Pa, and oxygen plasma can be easily obtained by conducting a surface treatment.

According to claim 10 of this invention, the processing pressure P with the oxygen gas is in a range of 150 Pa to 250 Pa, with an effect of easily obtaining an effect of the surface treatment.

According to claim 11 of this invention, the surface treatment can be conducted within the same process chamber as the chamber of the process apparatus where the step of (b) is conducted, with an effect of achieving a contact which is low resistance.

According to claim 12 of this invention, the surface treatment can be conducted in either of an other process chamber different from a process chamber of a process apparatus where the step of (b) is conducted, and a different process apparatus, with an effect of achieving contact which is low in resistance.

A method of forming another contact hole according to claim 13 of this invention comprises steps of removing adherent product on a chrome electrode surface attached by a dry etching in the contact hole forming operation by conducting a plasma processing operation in a reactive ion etching mode under a proper processing pressure in an oxygen gas after forming the contact hole at the step of (b), with an effect of having low, better contact.

According to claim 14 of this invention, when a processing pressure P in the oxygen gas is in a range of 150 Pa to 250 Pa, with an effect that the surface treatment can be conducted with high efficiency.

According to claim 13 of this invention, the surface treatment can be conducted within a process chamber the same as the chamber of a process apparatus where the step of (b) is conducted, thus achieving an effect of achieving a contact which is low resistance.

According to claim 14 of this invention, the surface treatment can be conducted in a process chamber different from a chamber of a process apparatus where the step of (b) is conducted, or in a different process apparatus, thus achieving an effect of achieving a contact which is low resistance.

An another method for forming a contact hole according to this invention has an effect of lowering a contact resistance, despite the plasma processing conditions of dry etching, resist ashing and so on when the contact hole is processed in wet process in mixed liquid of ammonium cerium nitrate and nitric acid after forming the contact hole in the (b) step.

An active matrix substrate according to this invention comprises a substrate, a first electrode formed on a substrate, an insulating film covering the first electrode and the substrate, a contact hole formed through the insulating film, a second electrode covering the contact hole. The first electrode is made of chrome, and the second electrode is made of indium tin oxide. As the second electrode is in direct contact with the first electrode through the contact hole, with an effect of obtaining superior quality free from inferior product according to the contact resistance.

A liquid crystal displaying apparatus according to this invention comprises an active matrix substrate, an opposite substrate, a liquid crystal material interposed by both substrates. An active matrix substrate comprises a substrate, a first electrode formed on a substrate, an insulating film covering the first electrode and the substrate, a contact hole formed through the insulating film, a second electrode formed by covering the contact hole. The first electrode is made of chrome, the second electrode is made of indium tin oxide, and the second electrode is in direct contact of the first electrode through the contact hole, thus achieving an effect of obtaining superior quality free from inferior product according to the contact resistance.

It should be understood that the apparatus and methods which have been shown and described herein are illustrative of the invention and are not intended to be limitative thereof. Clearly, those skilled in the art may conceive of variations or modifications to the invention. However, any such variations or modifications which falls within the purview of this description are intended to be included therein as well. The scope of the invention is limited only by the claims appended hereto.

Though several embodiments of the present invention described above, it is to be understood that the present invention is not limited to the above-mentioned embodiments, and various changes and modifications may be made in the invention without departing from the spirit and scope thereof.

What is claimed is:

1. A method for forming a contact hole in an active matrix substrate, said method comprising:

depositing an insulating film covering a first electrode provided on a substrate and said substrate;

forming a contact hole by patterning said insulating film by means of dry etching; and forming a second electrode and contacting said second electrode with said first electrode;

wherein said dry etching is performed using a first dry etching gas which is a mixture of $CF_4$ gas and $O_2$ gas and a flow rate of the $O_2$ gas to said mixture is in the range of 50% to 95% during said dry etching.

2. The method for forming a contact hole in an active matrix substrate of claim 1, wherein said first electrode is comprised of any one member selected from the group consisting of chrome, aluminum and indium tin oxide.

3. A method for forming a contact hole in an active matrix substrate, said method comprising steps of:

depositing an insulating film covering a first electrode provided on a substrate;

forming a contact hole by patterning said insulating film by means of dry etching; and forming a second electrode and contacting said second electrode with said first electrode;

wherein after forming a contact hole the surface treatment is performed for said contact hole by a reactive ion etching mode under a condition in which a pressure P for said surface treatment is in a range of 100 Pa to 400 Pa.

4. The method for forming a contact hole in an active matrix substrate of claim 1, wherein inert gas is further mixed with said first dry etching gas.

5. The method for forming a contact hole in an active matrix substrate of claim 4, wherein said inert gas is any one member selected from the group consisting of argon and helium.

6. The method for forming a contact hole in an active matrix substrate of claim 1, wherein further comprising using a second dry etching gas comprised of any one member selected from the group consisting of fluorine gas and a mixture of fluorine gas and $O_2$ gas in a preliminary dry etching of at least 50% of said insulating film and thereafter performing said dry etching using said first dry etching gas having said $O_2$ gas flow rate and said $CF_4$ gas flow rate until obtaining an etching amount.

7. The method for forming a contact hole in an active matrix substrate of claim 6, wherein inert gas is further mixed with said first dry etching gas.

8. A method for forming a contact hole in an active matrix substrate, said method comprising:

depositing an insulating film covering a first electrode provided on a substrate and said substrate;

forming a contact hole by patterning said insulating film by means of dry etching; and forming a second electrode and contacting said second electrode with said first electrode;

wherein n said after forming the contact hole by dry etching, performing plasma etching of the contact hole using $O_2$ gas at a pressure in the range of at least 50 Pa to 400 Pa.

9. The method for forming a contact hole in an active matrix substrate of claim 3, wherein said pressure P for said surface treatment is in a range of 150 Pa to 250 Pa.

10. The method for forming a contact hole in an active matrix substrate of claim 8, wherein a pressure P for said plasma etching using said $O_2$ gas is in a range of 150 Pa to 250 Pa.

11. The method for forming a contact hole in an active matrix substrate of claim 8, wherein said plasma etching with oxygen is performed in a same process chamber in which said forming of the contact hole is performed.

12. The method for forming a contact hole in an active matrix substrate of claim 8, wherein said plasma etching with oxygen is performed in another process chamber or another apparatus.

13. The method for forming a contact hole in an active matrix substrate of claim 3, wherein said surface treatment is performed in a same process chamber of a process apparatus in which said forming of the contact hole is performed.

14. The method for forming a contact hole in an active matrix substrate of claim 3, wherein said surface treatment is performed in another process chamber or another process apparatus.

* * * * *

UNITED STATES PATENT AND TRADEMARK OFFICE
CERTIFICATE OF CORRECTION

PATENT NO. : 6,054,392
DATED : April 25, 2000
INVENTOR(S) : Masashi Ura et al.

It is certified that error appears in the above-identified patent and that said Letters Patent is hereby corrected as shown below:

<u>Title page, item [30],</u>
The Foreign Application Priority Data is incorrect. It should be:
-- [30] Foreign Application Priority Data
   May 27, 1997   [JP]   Japan...........9-137255 --

Signed and Sealed this

Thirty-first Day of July, 2001

*Attest:*

*Nicholas P. Godici*

*Attesting Officer*

NICHOLAS P. GODICI
*Acting Director of the United States Patent and Trademark Office*